United States Patent
Kowkutla et al.

(10) Patent No.: US 10,574,235 B2
(45) Date of Patent: Feb. 25, 2020

(54) DUAL FUNCTION ANALOG OR DIGITAL INPUT/OUTPUT BUFFER

(71) Applicant: TEXAS INSTRUMENTS INCORPORATED, Dallas, TX (US)

(72) Inventors: Venkateswar Reddy Kowkutla, Allen, TX (US); Erkan Bilhan, Dallas, TX (US); Venkateswara Reddy Pothireddy, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/284,212

(22) Filed: Feb. 25, 2019

(65) Prior Publication Data

US 2019/0190521 A1    Jun. 20, 2019

Related U.S. Application Data

(63) Continuation of application No. 15/437,593, filed on Feb. 21, 2017, now Pat. No. 10,256,821.

(51) Int. Cl.
*H03K 19/0175*    (2006.01)
*H03K 3/037*    (2006.01)

(52) U.S. Cl.
CPC ..... *H03K 19/017509* (2013.01); *H03K 3/037* (2013.01)

(58) Field of Classification Search
None
See application file for complete search history.

(56) References Cited

U.S. PATENT DOCUMENTS

| | | |
|---|---|---|
| 6,509,758 B2 | 1/2003 | Piasecki |
| 6,981,090 B1 | 12/2005 | Kutz |
| 7,046,035 B2 | 5/2006 | Piasecki |
| 7,436,207 B2 | 10/2008 | Rogers |
| 8,004,887 B2 | 8/2011 | Roohparvar |
| 8,441,298 B1 | 5/2013 | Williams |
| 9,438,241 B1 | 9/2016 | Davidovic |
| 9,612,987 B2 | 4/2017 | Sullam |
| 9,948,301 B2 * | 4/2018 | Han ............... H03K 19/017509 |
| 2017/0093388 A1 | 3/2017 | Yang |

* cited by examiner

*Primary Examiner* — Jeffery S Zweizig
(74) *Attorney, Agent, or Firm* — Michelle F. Murray; Charles A. Brill; Frank D. Cimino

(57) ABSTRACT

A method and circuitry that enables an input/output pin (I/O) on a System on a Chip to function either as an analog or as a digital input/output without compromising the overall performance of the system, thus giving the automated test equipment full flexibility to maximize parallel testing for both analog and digital modules.

20 Claims, 2 Drawing Sheets

DUAL FUNCTION ANALOG OR DIGITAL INPUT/OUTPUT BUFFER

This application is a continuation of prior application Ser. No. 15/437,593, filed Feb. 21, 2017, currently pending, which is hereby incorporated by reference herein in its entirety.

TECHNICAL FIELD OF THE INVENTION

The technical field of this invention is dual function input/output buffers.

BACKGROUND OF THE INVENTION

Today's Systems on a Chip (SoC) have very high level of analog integration with multiple voltage regulators, voltage monitors, analog to digital and digital to analog converters, power on reset controllers and other systems which significantly increase the scope and complexity of manufacturing test coverage as well as the cost of testing. In order to reduce the SoC test time without compromising the test coverage and quality, a large number of analog test pins are required to enable the parallel testing of a number of analog modules. The analog test pins are normally dedicated pins that not only increase the package cost, but also reduce the number of available digital test pins due to limited number of channels provided by the Automated Test Equipment (ATE). This, in turn leads to increased test time for the digital logic as well.

SUMMARY OF THE INVENTION

A method and circuitry is shown that enables an input/output pin (I/O) to function either as an analog or as a digital input/output without compromising the overall performance of the I/O, thus giving the automated test equipment full flexibility to maximize parallel testing for both analog and digital modules.

BRIEF DESCRIPTION OF THE DRAWINGS

These and other aspects of this invention are illustrated in the drawings, in which.

DETAILED DESCRIPTION OF PREFERRED EMBODIMENTS

Figure 1:
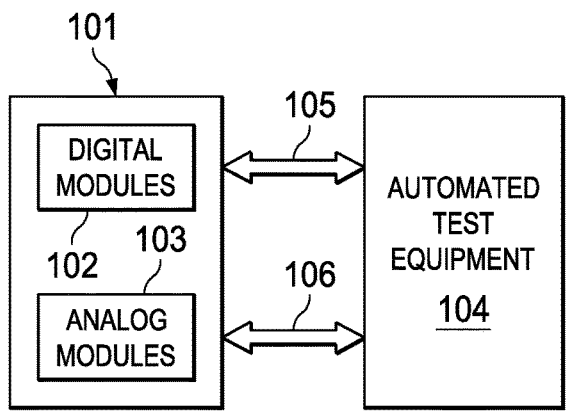
FIG. 1 shows the prior art implementation with separate digital and analog input/output connections between the System on a Chip under test and the Automated Test Equipment.

A prior art implementation is shown on FIG. 1. System on a Chip 101 containing a plurality of functional modules such as digital module 102 and analog module 103 is connected to automated test equipment 104. Connection is made by separate digital input/output connections 105 and analog input/output connections 106.

Figure 2:
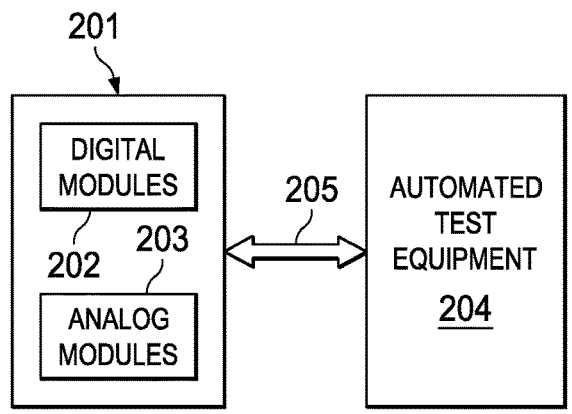
FIG. 2 shows the System on a Chip under test and the Automated Test Equipment connected by dual use analog and digital test connections.

FIG. 2 illustrates the method described herein. System on a chip 201 containing digital modules 202 and analog modules 203 is connected to automated test equipment 204 by dual function connections 205. Since these interconnections are operable to function either as digital or analog connections, the automated test equipment is able to optimize the testing function by dynamically allocating analog or digital connections as required for the test process.

Figure 3:
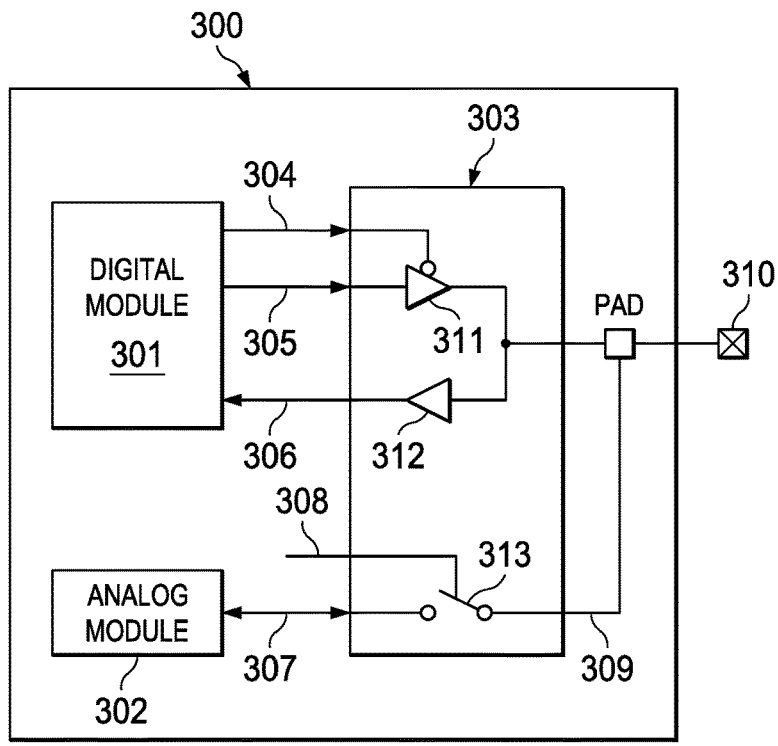
FIG. 3 shows an implementation of a dual analog/digital input/output buffer.

FIG. 3 describes an implementation of the dual function analog or digital input/output buffer implemented on the System on a Chip 300. Digital module 301 communicates to the dual function input/output buffer 303 through output connection 305 and input connection 306, with control connection 304 operable to switch the dual function buffer 303 between digital input or output by placing the output buffer 311 in high impedance state during input to buffer 312. The dual function buffer 303 connected to SoC package pin 310.

Analog module 302 communicates with the dual function buffer 303 through bidirectional connection 307. Isolation analog switch 313, controlled by analog/digital function selection line 308 is operable to isolate the analog module 302 from the package I/O pin 310 when the switch is open, or to connect said analog module 302 via connection 309 to I/O pin 310 when the analog isolation switch 313 is closed, and output buffer 311 is in the high impedance state.

Figure 4:
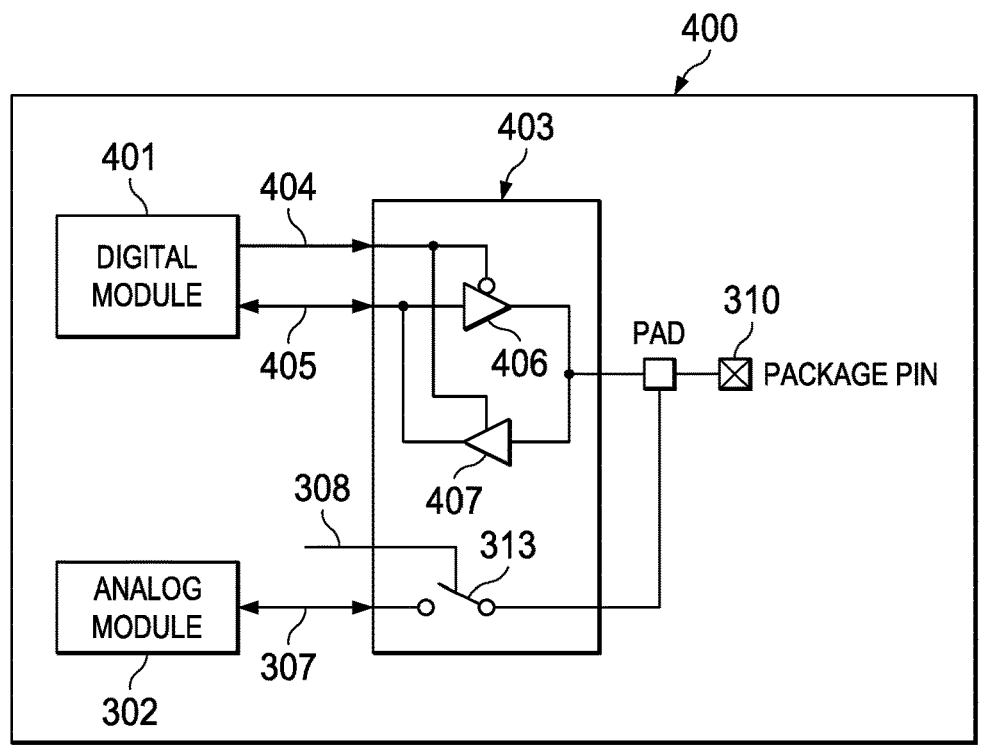
FIG. 4 shows an alternate implementation of a dual analog/digital input/output buffer.

FIG. 4 shows an alternate implementation of the dual function analog or digital input/output buffer implemented on the System on a Chip 400 that reduces the number of connections between the digital module and the digital input/output buffer. Digital module 401 communicates to the dual function input/output buffer 403 through bidirectional input/output connection 405 and input/output direction control connection 404. Direction control connection 404 will place buffer 406 in a high impedance state and enables buffer 407 when the input function is selected, and places buffer 407 in a high impedance state with buffer 406 enabled during output.

Figure 5:
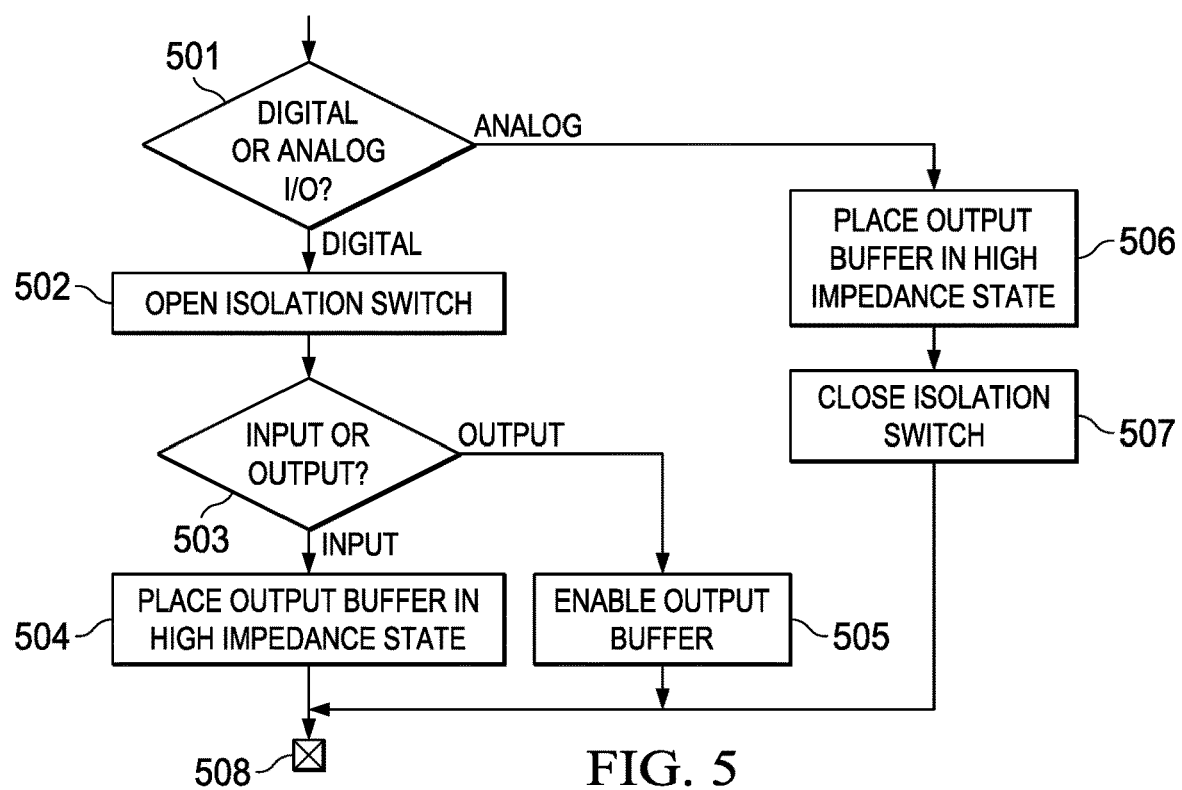
FIG. 5 shows a flowchart of the operating modes.

FIG. 5 shows a flowchart of the operation of the dual function input/output buffer. The analog or digital operation mode is selected in 501. In digital mode, the analog isolation switch 313 is opened in 502, then input or output mode is selected in 503. In input mode, the output buffer 311 is placed in the high impedance state in 504. In output mode, output buffer 311 is enabled in 505. The outputs from 504 and 505 are connected to SoC package pin 508.

If analog mode is selected in 501, output buffer 311 is placed in the high impedance state in 506, then isolation switch 313 is closed in 507 thus connecting the analog modules to I/O pin 508.

The described implementation in addition to optimizing the SoC test sequence also optimizes the overall area of the dual function I/O buffer 303 by sharing the Electro Static Discharge (ESD) protection of digital input/output and analog feedthrough input/output functions and by utilizing unused areas inside the digital input/output functions for the analog switch integration.

What is claimed is:

1. A system, comprising:
    an analog module;
    a digital module;
    a package pin; and
    an analog/digital input/output buffer coupled between the analog module and the package pin, and between the digital module and the package pin, the analog/digital input/output buffer comprising:

an analog isolation switch coupled between the analog module and the package pin, the analog isolation switch configured to couple the analog module to the package pin while the analog/digital input/output buffer is in an analog mode; and a digital buffer circuit coupled between the digital module and the package pin, the digital buffer circuit configured to couple the digital module to the package pin, to test the digital module, while the analog/digital input/output buffer is in the digital mode.

2. The system of claim 1, wherein the system is a system-on-a-chip (SoC).

3. The system of claim 1, wherein the package pin is configured to test the analog module while the analog module is coupled to the package pin.

4. The system of claim 1, wherein the analog isolation switch is further configured to isolate the analog module from the package pin, while the analog/digital input/output buffer is in the digital mode.

5. The system of claim 1, wherein the digital buffer circuit comprises:
a digital output buffer coupled between an output of the digital module and the package pin; and
a digital input buffer coupled between an input of the digital module and the package pin.

6. The system of claim 5, wherein the digital output buffer is configured to:
enable, in response to determining that a control signal indicates that a digital output mode is selected; and
enter a high impedance state, in response to determining that the control signal indicates that either a digital input mode is selected or that the analog/digital input/output buffer is in the analog mode.

7. The system of claim 1, wherein the digital buffer circuit comprises:
a digital output buffer coupled between a bidirectional input/output connection of the digital module and the package pin; and
a digital input buffer coupled in parallel with the digital output buffer.

8. The system of claim 1, wherein the package pin is configured to be coupled to automated test equipment.

9. The system of claim 1, wherein the analog isolation switch is further configured to:
close, in response to a first indication of a function selection line; and
open, in response to a second indication of the function selection line.

10. The system of claim 1, wherein the system utilizes areas inside an area of the digital buffer circuit for analog switch integration.

11. An analog/digital input/output buffer, comprising:
an analog isolation switch coupled between an analog module and a package pin, the analog isolation switch configured to couple the analog module to the package pin, while the analog/digital input/output buffer is in an analog mode;
a digital output buffer coupled between a digital module and the package pin, the digital output buffer configured to couple the digital module to the package pin, while the analog/digital input/output buffer is in a digital output mode; and
a digital input buffer coupled between the digital module and the package pin, the digital input buffer configured to couple the digital module to the package pin, while the analog/digital input/output buffer is in a digital input mode, wherein the package pin is configured to be coupled to automated test equipment.

12. The analog/digital input/output buffer of claim 11, wherein the package pin is configured to test the analog module while the analog module is coupled to the package pin, to test the digital module while the digital output buffer is coupled to the package pin or while the digital input buffer is coupled to the package pin.

13. The analog/digital input/output buffer of claim 11, wherein the analog isolation switch is further configured to isolate the analog module from the package pin, while the analog/digital input/output buffer is in the digital output mode or in the digital input mode.

14. The analog/digital input/output buffer of claim 11, wherein the digital output buffer is coupled between an output of the digital module and the package pin, and wherein the digital input buffer coupled between an input of the digital module and the package pin.

15. The analog/digital input/output buffer of claim 14, wherein the digital output buffer is configured to:
enable, in response to determining that a control signal indicates that the digital output mode is selected; and
enter a high impedance state, in response to determining that the control signal indicates that either the digital input mode is selected or that the analog/digital input/output buffer is in the analog mode.

16. The analog/digital input/output buffer of claim 11, wherein the digital output buffer is coupled between a bidirectional input/output connection of the digital module and the package pin, and wherein the digital input buffer coupled in parallel with the digital output buffer.

17. The analog/digital input/output buffer of claim 11, wherein the analog isolation switch is further configured to:
close, in response to a first indication of a function selection line; and
open, in response to a second indication of the function selection line.

18. A method of testing a System on a Chip (SoC), the method comprising:
closing an analog isolation switch of an analog/digital input/output buffer of the SoC, to couple an analog module to a package pin of the SoC, in response to determining that the analog/digital input/output buffer is in an analog mode; and
in response to determining that the analog/digital input/output buffer is in a digital mode:
opening the analog isolation switch, to isolate the analog module from the package pin;
enabling an output buffer, to couple a digital circuit to output data to the package pin, in response to determining that a digital output mode is selected;
placing the output buffer in a high impedance state, to couple the digital circuit to receive data from the package pin using a digital input buffer, in response to determining that a digital input mode is selected; and
testing the digital circuit.

19. The method of claim 18, further comprising:
testing the analog module while the analog module is coupled to the package pin.

20. An analog/digital input/output buffer, comprising:
an analog isolation switch coupled between an analog module and a package pin, the analog isolation switch configured to couple the analog module to the package pin, while the analog/digital input/output buffer is in an analog mode;

a digital output buffer coupled between a digital module and the package pin, the digital output buffer configured to couple the digital module to the package pin, while the analog/digital input/output buffer is in a digital output mode; and a digital input buffer coupled between the digital module and the package pin, the digital input buffer configured to couple the digital module to the package pin, while the analog/digital input/output buffer is in a digital input mode, wherein the digital output buffer is coupled between a bidirectional input/output connection of the digital module and the package pin, and wherein the digital input buffer coupled in parallel with the digital output buffer.

* * * * *